(12) United States Patent   (10) Patent No.: US 7,468,560 B2
Guengerich et al.   (45) Date of Patent: Dec. 23, 2008

(54) SEMICONDUCTOR DEVICE WITH MICRO CONNECTING ELEMENTS AND METHOD FOR PRODUCING THE SAME

(75) Inventors: Volker Guengerich, Regensburg (DE); Horst Theuss, Wenzenbach (DE)

(73) Assignee: Infineon Technologies AG, Munich (DE)

( * ) Notice: Subject to any disclaimer, the term of this patent is extended or adjusted under 35 U.S.C. 154(b) by 312 days.

(21) Appl. No.: 11/335,125

(22) Filed: Jan. 19, 2006

(65) Prior Publication Data

US 2006/0185892 A1   Aug. 24, 2006

(30) Foreign Application Priority Data

Jan. 19, 2005   (DE) .................. 10 2005 002 707

(51) Int. Cl.
H01L 23/48   (2006.01)
H01L 29/40   (2006.01)

(52) U.S. Cl. ............... 257/784; 257/664; 257/E23.024; 174/71 C (58) Field of Classification Search ................. 257/784, 257/664, 728, E23.024; 174/262, 88 C, 71 C
See application file for complete search history.

(56) References Cited

U.S. PATENT DOCUMENTS

| 2,671,127 | A | * | 3/1954 | Hope ..................... 174/88 C |
| 3,698,082 | A | * | 10/1972 | Hyltin et al. ................ 29/856 |
| 4,600,907 | A |  | 7/1986 | Grellman et al. |
| 4,816,618 | A |  | 3/1989 | Bongianni |
| 5,057,798 | A |  | 10/1991 | Moye et al. |
| 5,203,079 | A |  | 4/1993 | Brinkman et al. |
| 5,304,843 | A |  | 4/1994 | Takubo et al. |
| 5,418,505 | A |  | 5/1995 | Agarwal et al. |
| 6,302,732 | B1 |  | 10/2001 | Budman et al. |
| 6,674,174 | B2 |  | 1/2004 | Chungpaiboonpatana et al. |
| 6,770,822 | B2 |  | 8/2004 | Pasternak et al. |
| 6,778,406 | B2 | * | 8/2004 | Eldridge et al. ............. 361/776 |
| 7,042,067 | B2 | * | 5/2006 | Giaretta et al. .............. 257/664 |
| 2003/0159262 | A1 |  | 8/2003 | Pasternak et al. |

FOREIGN PATENT DOCUMENTS

| EP | 0 523 730 | 7/1992 |
| EP | 0563 969 | 10/1993 |
| EP | 0 601 323 | 6/1994 |
| FR | 2541912 | 9/1984 |
| GB | 2193833 | 2/1988 |
| JP | 2001352166 | 12/2001 |

* cited by examiner

*Primary Examiner*—Nitin Parekh
(74) *Attorney, Agent, or Firm*—Dicke, Billig & Czaja, PLLC (57) ABSTRACT

A semiconductor device with micro connecting elements and method for producing the same disclosed. In one embodiment, the semiconductor device includes a number of micro connecting elements for the high-frequency coupling of components of the semiconductor device. The micro connecting elements have an at least three-layered structural form with a first layer of conducting material, a second layer of insulating material and a third layer of conducting material. In this configuration, the first and third layers and extend along a common center line and shield one another against electromagnetic interference fields. The first and third layers and are fixed on correspondingly adapted pairs of contact terminal areas of the components.

12 Claims, 10 Drawing Sheets

# SEMICONDUCTOR DEVICE WITH MICRO CONNECTING ELEMENTS AND METHOD FOR PRODUCING THE SAME

CROSS-REFERENCE TO RELATED APPLICATIONS

This Utility Patent Application claims priority to German Patent Application No. DE 10 2005 0002 707.5, filed on Jan. 19, 2005, which is incorporated herein by reference.

FIELD OF THE INVENTION

The invention relates to a semiconductor device with micro connecting elements and a method for producing the same. Such micro connecting elements are electrical connections between a semiconductor chip and a wiring substrate or a semiconductor chip and a flat conductor frame, to ensure that the signal processing arranged on the semiconductor chip can be transferred to the outside, to larger contact units. The connection by means of such micro connecting elements is ensured by thin wires, which are usually produced from gold or aluminium and have a diameter in a range less than 50 micrometers.

BACKGROUND

In the case of these micro connecting elements, the electrical contacting takes place on contact areas of the semiconductor chip and contact terminal areas of the wiring substrate and/or a printed circuit board and/or a leadframe by an ultrasonic friction-welded connection, the micro connecting elements of the bonding wire a few micrometers thick entering into a low-melting eutectic alloy with the coating of the contact areas with terminal areas. However, these wire connections have the disadvantage in high-frequency applications that they form parasitic inductances. In an approximate estimate, this parasitic inductance is around 1 nH/mm and can lead to stray signals being coupled into the signal flow of the high-frequency semiconductor device. There may also be an antenna effect, which leads to the transmission of electromagnetic waves.

In the case of semiconductor devices with bonding wires pressed into a plastic package molding compound, parasitic parallel capacitances which impair the high-frequency transmission characteristics of such semiconductor devices form, depending on the dielectric constant of the plastic package molding compound. This is manifested by electrical losses, a reduction of the cutoff frequency and changes in the adaptation of input circuits and output circuits. These effects, which are attributable to the use of bonding wires, are undesired and make it more difficult to realize high-frequency electric circuits with corresponding semiconductor devices.

These disadvantages can be partly reduced by the use of flip-chip contacts, with which the parasitic inductances are smaller. It is also attempted to achieve shorter signal paths. However, the technique of flip-chip contacts also has its limits with respect to high-frequency technology, since not all applications allow themselves to be implemented as flip-chip semiconductor devices owing to the design of the circuits. In particular if relatively long electrical signal paths become necessary for the electromagnetic waves, the flip-chip method is unsuccessful. Furthermore, flip-chip contacts are only suitable to a limited extent for operating at high frequency, since they neither have waveguide characteristics nor are protected in the event of electromagnetic fields being coupled in.

For these and other reasons, there is a need for the present invention.

SUMMARY

The present invention provides a semiconductor device with micro connecting elements. In one embodiment, the semiconductor device include a number of micro connecting elements for the high-frequency coupling of components of the semiconductor device. The micro connecting elements have an at least three-layered structural form with a first layer of conducting material, a second layer of insulating material and a third layer of conducting material. The first and third layers extending along a common center line, shielding one another against interference fields and being fixed on correspondingly adapted pairs of contact terminal areas of the components.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The present invention provides a semiconductor device which has micro connecting elements which serve for the high-frequency coupling of components of the semiconductor device. At the same time, parasitic inductances and/or parasitic parallel capacitances are to be reduced without making the length of the connecting elements drastically smaller; rather, the micro connecting elements are to make it possible to bridge even relatively great distances between a semiconductor chip and a wiring substrate, or a printed circuit board or a leadframe, with low losses.

In one embodiment, according to the invention, a semiconductor device with micro connecting elements is provided, the semiconductor device having a number of micro connecting elements for the high-frequency coupling of components of the semiconductor device. For this purpose, the micro connecting elements have a three-layered structural form with a first layer of conducting material, a second layer of insulating material and a third layer again of conducting material. In this case, the first and third layers extend along a common center line. This center line forms an axis of symmetry for the first and third layers. These micro connecting elements shield one another against interference fields and are fixed on correspondingly adapted pairs of contact terminal areas of the components of the semiconductor device.

In this embodiment it is advantageously possible for the wire bonding connections on the pairs of contact terminal areas to be carried out in a way similar to before. However, a purely metallic wire, as in wire bonding, is not used, but a wire coated with a dielectric of glass and/or a polymer, or an electrically conducting strip coated with a glass and/or a polymer. The dielectric is in this case coated by a further metal layer, so that a waveguide in the form of a micro coaxial cable or a micro strip conductor is produced. With this semiconductor device, the following is advantageously achieved:

1. The use of micro connecting elements structurally formed in this way makes it possible to bridge relatively great distances between a semiconductor chip and a wiring structure;
2. The high-frequency characteristics of the waveguide provided in this way are defined and have low losses, the high-frequency characteristics being defined by the diameter and the materials of the conducting layers and of the dielectric;
3. That, on account of their metallic shielding characteristics, the micro connecting elements according to the invention are not susceptible to external radiation influences and an antenna effect cannot occur;
4. That, by appropriate connecting techniques, high-frequency-adapted signals can be coupled with low reflections and low losses directly from the micro connecting elements into corresponding micro strip lines on the semiconductor chip or on the wiring substructure; and
5. That the semiconductor device according to the invention, with the at least three-layered micro connecting elements, creates a possible way of further increasing the previously achieved cutoff frequencies and of providing low-loss high-frequency couplings between the components of a semiconductor device.

In one preferred embodiment of the invention, the micro connecting elements have a strip form. In this embodiment, outer strips form the first layer and the third layer and the middle strip has the second layer includes a dielectric. The center line or axis of symmetry in this strip form lies in the region of the second layer. Such a strip form comprising parallel running, symmetrically structured interconnects makes possible a low-loss high-frequency connection between individual components of a semiconductor device. The length of the wiring is of secondary importance.

In another preferred embodiment of the invention, the micro connecting elements have a coaxial form, an inner conductor having the first layer and an outer conductor the third layer, and the center line being arranged in the region of the first layer as a coaxial axis. For this purpose, a bonding wire with a minimum diameter of between 2 µm and 30 µm is uniformly coated with a dielectric of glass or a polymer and the outer casing of the dielectric is additionally provided with a further metal layer. It is consequently possible to bond these two conductive layers of an inner conductor and an outer conductor on correspondingly arranged pairs of contact terminal areas. These pairs of contact terminal areas are designed in such a way that a central contact terminal disk receives the inner conductor, which can be fixed on the central contact terminal disk. A further concentrically arranged contact terminal disk of the pair of contact terminal areas can be contacted with the outer conductor, so that it is possible to pass on the high-frequency signals, which are supplied by means of such a multilayered wiring system, to corresponding strip conductors on semiconductor chip surfaces and/or wiring substrate surfaces.

In another embodiment of the invention, the coaxial form may be completed by a further, fourth outer layer, this fourth layer consisting of insulating material. A micro connecting element structurally formed in this way has the advantage that the connection can and may not only run within the semiconductor device, but it is possible on account of the outer insulating layer to divert high-frequency signals from the semiconductor device to an external component. Furthermore, the micro connecting elements with such a fourth layer can cross over within the semiconductor device without any problem.

In another embodiment of the invention, the adapted pairs of contact terminal areas have a transition to plane-parallel strip-form interconnects on an upper side of the semiconductor chip and/or on an upper side of the wiring substrate and/or on an upper side of a leadframe or a printed circuit board. The transition from a multilayered micro connecting element according to the invention can be formed without any reflection and with low losses. In this embodiment it is possible to go over from a coaxial micro connecting element to a strip structure on the semiconductor chips or the wiring substrates or the leadframes. Furthermore, the micro connecting elements may be supplied with high-frequency signals by a strip conductor with parallel strip-form interconnects on an upper side of the semiconductor chip and/or on an upper side of a wiring substrate and/or on an upper side of a leadframe.

In another embodiment of the invention, the pairs of contact terminal areas have concentrically arranged pairs of disks. In this case, an inner disk is electrically connected to the first layer and an outer disk is electrically connected to the third layer. This concentrically arranged pair of disks has the advantage that it can be adapted exactly in its extent to a coaxial micro connecting element, so that the transition can be formed without any reflection and with low losses.

In another embodiment of the invention, the outer disk of the contact terminal areas of a pair of contact terminal areas has a perpendicularly projecting annular sharp edge. The diameter of the sharp edge is adapted to the micro connecting line in such a way that this sharp edge initially only effectively enters the second layer comprising a dielectric when the micro connecting element is applied. In this case, the annular sharp edge widens the outer electrically conducting metal layer of the micro connecting element and brings about a contact connection between the outer disk with the annular sharp edge and the outer layer of the micro connecting element. By contrast, the inner conductor has no contact with the outer disk or the annular sharp edge, but instead, as the dielectric is penetrated, moves onto the annular sharp edge, into a metallized aperture provided for the purpose, and joins together with the corresponding metal coating of the aperture. The action of the ultrasonic device achieves the effect that the outer conductor of the coaxial micro connecting element joins with the annular outer disk and the inner conductor joins with the correspondingly provided inner disk in the aperture.

In another preferred embodiment of the invention, the inner disk is arranged offset in height with respect to the outer disk on a surface of the semiconductor chip and/or on a surface of the wiring substrate and/or on a surface of the leadframe. This embodiment has the advantage that the micro connecting element according to the invention can be coupled on without any reflection and with low losses in a line arranged on the upper sides of the components that comprises two parallel strips.

Furthermore, it is possible for the pairs of contact terminal areas to have contact areas arranged in pairs, the electrically conducting layers of the micro connecting elements being fixed on the contact areas of a pair of contact terminal areas, and the pairs of contact terminal areas going over to plane-parallel strip-form interconnects in the components of the semiconductor device. These contact areas arranged in pairs are particularly suitable for receiving beveled ends of micro connecting elements and connecting them to the circuit of a semiconductor chip or a wiring substrate.

In another preferred embodiment of the invention, the pairs of contact terminal areas may have solder depots, so that it is possible to position the inner conductors and the outer conductors on corresponding solder depots and fuse them with the soldering material. Instead of the solder depots, coatings which are suitable for a bonding technique to create ultrasonic friction-welded connections may also be provided on the pairs of contact terminal areas. In this embodiment, the composition of the conductive layers of the micro connecting elements, the material of the contact areas or the coating of the contact areas plays a decisive role. Consequently, metallic first and third layers of gold can be bonded at low temperature onto a coating of aluminium, because the two-phase diagram for Au/Al has a range for a eutectic melt which allows the two metal components to be fused one into the other at low temperature.

To facilitate the transition from the components to the micro connecting elements, the latter may also have coaxial contact vias. For this purpose, the micro connecting element is placed with its inner conductor onto the inner conductor of the contact via and the outer conductor of the coaxial micro connecting element is placed onto the outer conductor of the contact via.

In another embodiment, a method for producing an electrical connection between components of a semiconductor device and micro connecting elements has the following method. A micro connecting element is produced from three layers, in that a first layer comprising an electrical conductor is applied, a second layer comprising an insulating layer is applied and a third layer including a conducting material, such as a metal, is applied to the second layer including a dielectric layer. Furthermore, this method includes the production of components of the semiconductor device with at least one pair of contact terminal areas comprising coaxially arranged disks and/or contact areas arranged in pairs. In this embodiment, the coaxially arranged disks are intended for electrically connecting a micro connecting element which has a coaxial form, and the contact areas arranged in pairs are preferably intended for micro connecting elements in strip form.

The corresponding pairs of contact terminals are prepared for the connecting and fixing of the micro connecting elements. The ends of the layers of the micro connecting elements also undergo preparation before they are fixed on the pairs of contact terminals. For applying and contacting the micro connecting elements, firstly the components are heated up and subsequently the metallically conducting layers of the micro connecting elements are fixed on the heated-up pairs of component terminal areas by corresponding auxiliary tools.

This method produces reliable electrical connections between corresponding pairs of contact terminal areas on the components and the electrically conducting layers of the micro connecting elements. To facilitate this connecting, the pairs of contact terminal areas may be specially prepared, in that solder depots are applied to the contact areas arranged in pairs or the coaxially arranged disks. When the components are heated up, the solder depots melt and, by simple wetting, act together with the conducting layers of the micro connection lines as the components cool down to produce a reliable transition from the micro connection lines to the internal strip lines of the components of the semiconductor device.

Another kind of preparation of the pairs of contact terminal areas is that of coating the contact areas arranged in pairs or the coaxially arranged disks with a bondable coating, which preferably comprises gold, aluminium or alloys of the same.

The combination of the elements gold and aluminium has the advantage that the bonding process is facilitated by the action of ultrasound at low eutectic temperatures of the two-phase diagram of these two elements.

In another preferred embodiment of the invention, to prepare the ends of the layers of the micro connecting elements, these ends of the layers are shortened in steps, the first layer protruding further from the micro connecting element than the second layer and the third layer. This stepped arrangement of the layers at the ends of each of the micro connecting elements has the advantage that vertical mounting in relation to the horizontal pair of contact terminal areas can be reliably performed.

Furthermore, the ends of the layers of a micro connecting element may be prepared by clipping or cutting them off at an angle, the layers clipped at an angle being fixed on the pairs of contact terminal areas at an angle α to their surface. In this case, the angle α determines the size of the surface-area extent of the metallic layers, for the contacting on the pairs of contact terminal areas. The shallower the angle, the larger the surface-area extent that is available for a transition to a component of a semiconductor device.

Furthermore, it is provided that, for the simultaneous fixing of a number of layers of a micro connecting element on a pair of contact terminal areas, a tool which has a hollow stylus is used. This hollow stylus receives the coaxially formed micro connecting element, from which an inner conductor already protrudes. It guides this inner conductor into a hole contact with an inner disk on a component of the semiconductor device. The outer casing of the tool has at the end a collar for spreading and pressing on the outer conductor of the coaxially formed micro connecting element. For this purpose, the hollow stylus is excited by ultrasonic vibration to perform bonding, it being possible for this purpose for the components to be heated up at the same time to facilitate the production of the connection. This method achieves the effect that a multiplicity of micro connecting elements can be connected to individual components of semiconductor devices in a shielded manner. If an element with a coaxial form is not available for a micro connecting element, the following method is carried out with a correspondingly adapted tool.

For the simultaneous fixing of a number of layers of a micro connecting element on a pair of contact terminal areas comprising contact areas arranged in pairs, a tool which has a pair of styluses with two legs is used. The distance between the two legs of the pair of styluses is adapted to the distance between the contact areas arranged in pairs. A beveled end of a micro connecting element is then arranged between the legs and the contact areas. Finally, by lowering and pressing on the beveled electrically conducting layers of the micro connecting element, the layers are fixed on the contact areas under ultrasonic action, the component preferably also being heated up in the process. Consequently, by simple preparation, that is cutting the ends of the micro connecting elements at an angle, a reliable transition from the micro connecting elements to the components of the semiconductor device is created.

Figure 1:
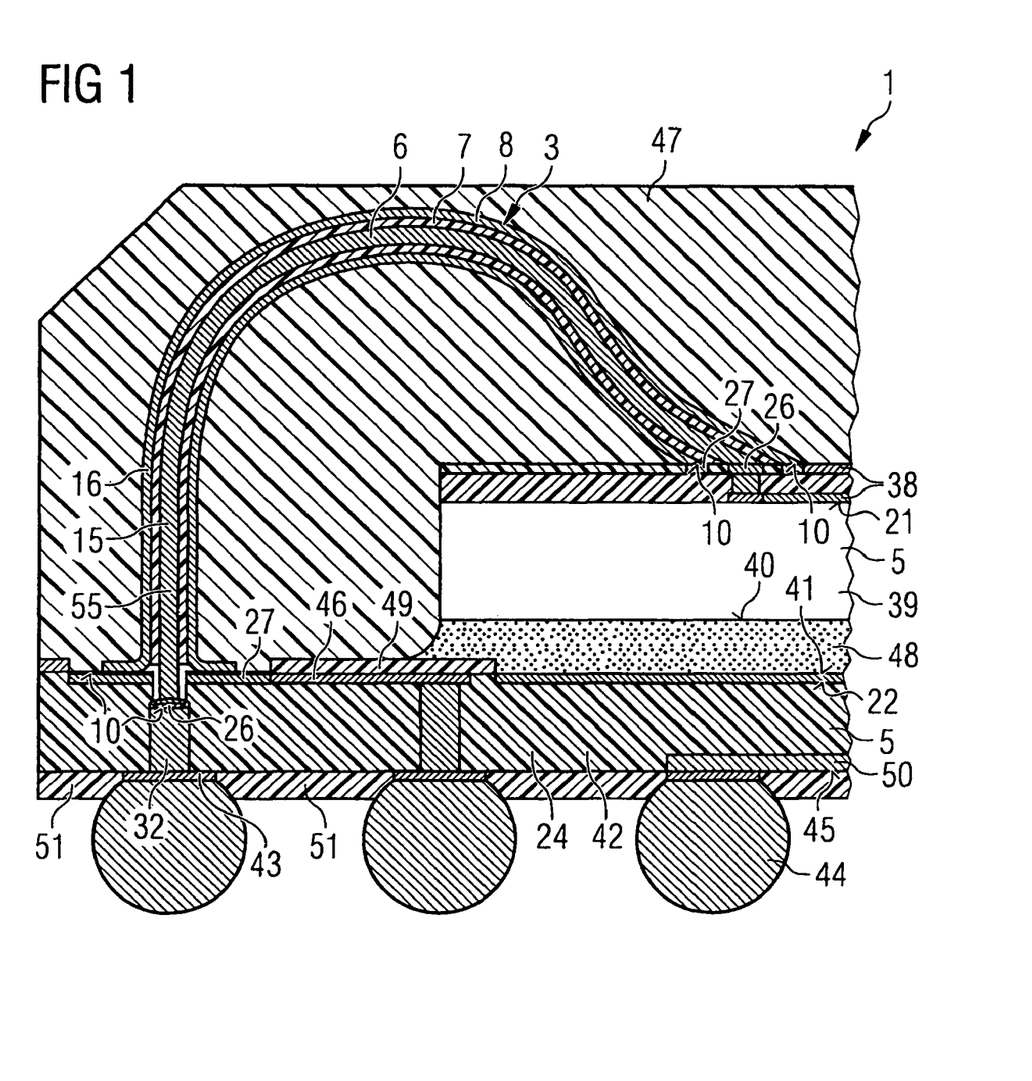
FIG. 1 illustrates a schematic cross section through a semiconductor device with a micro connecting element, according to a first embodiment of the invention.

FIG. 1 illustrates a schematic cross section through a semiconductor device 1 with a micro connecting element 3 according to a first embodiment of the invention. The micro connecting element 3 is of a multilayered structural form, comprising three layers. A first layer 6 is a bonding wire of metallically conducting material such as gold, aluminium or copper or alloys of the same. A second layer 7 is of insulating dielectric material and completely surrounds the central bonding wire 55 of the first layer 6. A third layer 8 of conducting material is applied to the insulating layer of the second layer 7, so that this micro connecting element of the first embodiment of the invention represents a micro coaxial wire with a central inner conductor 15 and an outer conductor 16 arranged coaxially in relation to the inner conductor 15.

This outer conductor 16 provides shielding against electromagnetic interference fields, so that no interference fields can adversely influence the high-frequency signal flow between a semiconductor chip 39 and a circuit carrier 24 by way of such a connecting element. Furthermore, the micro connecting element 3 eliminates the possibility of an antenna effect, which in the case of conventional bonding wires can contribute to the transmission of high-frequency energy. The coaxial form of the bonding connection additionally has the effect of creating a low-loss inner conductor, defined by the diameter and the materials of the conducting layers and the dielectric. On the upper side 21 of the semiconductor chip 39, the coaxial micro connecting element 3 is connected by way of a concentrically arranged pair of contact terminal areas 10 to a pair of strip lines 38, which lead to individual electrodes of the semiconductor elements of an integrated circuit of the semiconductor chip 39.

The semiconductor chip 39 is connected with its back side 40 on a metallically conducting contact terminal area 41 on the upper side 22 of a wiring substrate 42. The wiring substrate 42 has on its underside external contact areas 43 with external contacts 44 in the form of solder balls. The active upper side 21 of the semiconductor chip 39 with the circuits integrated there is electrically connected by way of the micro connecting line 3 to the wiring substrate 42, the inner conductor 15 going over into a contact via 32, which for its part is connected by way of an external contact area 43 on the underside 45 of the wiring substrate 42 to the external contact 44.

The outer conductor 16 of the coaxial micro connecting element 3 is connected by way of a wiring structure 46 and a further contact via 32 to a neighboring external contact 44. For the wiring within the wiring substrate, as in the case of the semiconductor chip 39, pairs of strip conductors may also be provided on the upper side 22 of the wiring substrate 42 in order to direct high-frequency signals to the external contacts 44. In this form of the invention, the semiconductor chip 39 and the coaxial connecting element 3 on the wiring substrate 42, which is used here as a circuit carrier 24, are embedded in a plastic package molding compound 47.

A conducting adhesive layer 48 connects the back side 40 of the semiconductor chip 39 electrically to the contact terminal area 41 of the wiring substrate 42. To the extent to which it extends under the semiconductor chip 39, the remaining wiring structure 46 is protected by an insulating protective layer 49, in order to avoid short-circuits occurring by way of the back side 40 of the semiconductor chip 39. Another possible way of connecting the external contacts 44 to the micro connecting element 3 by way of corresponding contact vias 32 is that a further wiring structure 50 is also provided on the underside 45 of the wiring substrate 42. The lower wiring structure 50 may be protected from being wetted by the material of the external contacts 44 by an insulating solder resist layer 51.

Figure 2:
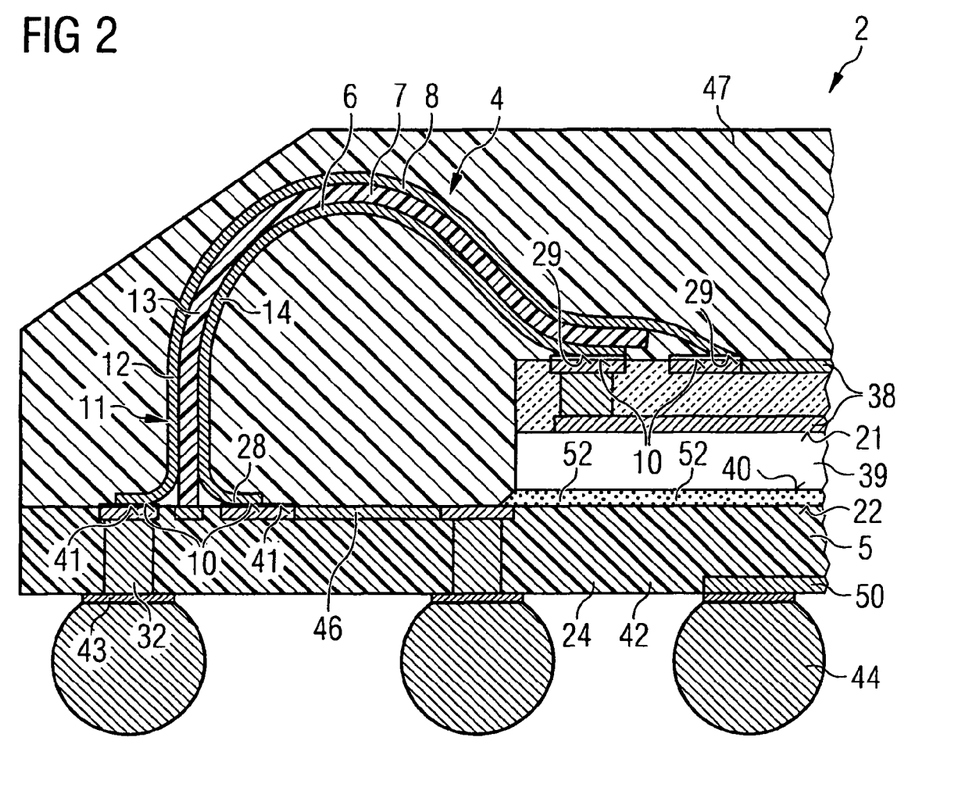
FIG. 2 illustrates a schematic cross section through a semiconductor device with a micro connecting element, according to a second embodiment of the invention.

FIG. 2 illustrates a schematic cross section through a semiconductor device 2 according to a second embodiment of the invention. Components with the same functions as in FIG. 1 are identified by the same designations and are not separately explained. The difference between the semiconductor device 2 in FIG. 2 and the semiconductor device 1 according to FIG. 1 is that a strip-form waveguide is used as the micro connecting element 4. The strip-form waveguide as a micro connecting element 4 has three layers, a first metallic layer 6, a second insulating layer 7 and a third metallic layer 8. These three layers may be joined together in a sandwich-like manner to form a strip structure 11, and comprise a second strip 13 of insulating material on the two sides of which a first metallic strip 12 and a second metallic strip 14 are applied as metal coatings.

Arranged on the surface 21 of the semiconductor chip 39, which forms a component 5 of the semiconductor device 2, is a pair of strip lines 38, which has a pair of contact terminal areas 10, which has contact areas 29 arranged in pairs. The first metallic strip 12 ends on one of the contact areas 29 of the pair of contact areas 10 and the second metallic strip 14 ends on the second contact area 29 of the pair of contact areas 10. This is achieved by the strips being arranged in a stepped manner at the end of the metallic conducting strip form 11, the first strip 12 being made shorter than the second strip 13, and the third strip 14 being made longer than the second strip 13.

The connection of the micro connecting element 4 in strip structure 11 to the connecting structure 46 of the wiring substrate 42 is achieved by a pointed sharp edge 28 in the form of a cutting edge dividing the second layer 13 of insulating material and spreading it apart, so that the spread first strip 12 and the spread third strip 14 can be connected to corresponding contact terminal areas 41, arranged in pairs, of the wiring substrate 42.

A further difference between the second embodiment of the invention and the first embodiment of the invention is that the semiconductor chip 39 is fixed with its back side 40 on the upper side 22 of the wiring substrate 42 by way of a non-conducting insulating adhesive layer 52. This makes it possible to dispense with an additional insulating layer for the wiring structure 46, in particular if it extends under the semiconductor chip 39.

Figure 3A:
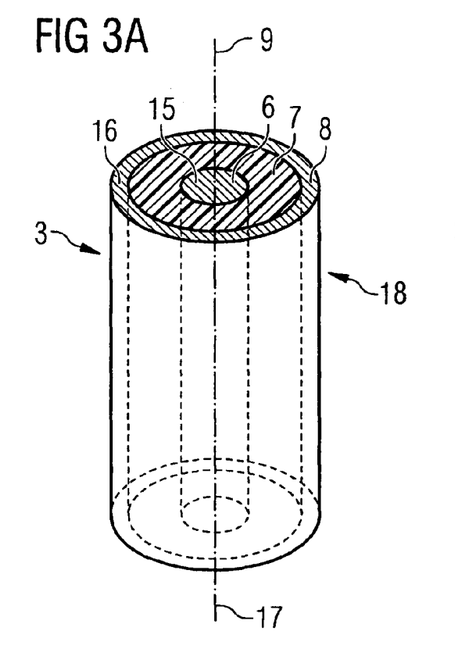
FIG. 3 illustrates a perspective view of coaxially formed micro connecting elements.

FIG. 3 illustrates a perspective view of coaxially formed micro connecting elements 3. The micro connecting elements 3 have as the center line 9 a coaxial axis 17, the inner conductor 15 being a bonding wire with a diameter of between 2 and 50 μm, which is surrounded by an insulating layer 7, which consists of a dielectric material such as glass or a polymer. The second layer 7 is covered by a metal layer, which forms the outer conductor 16 or the third layer 8. This coaxial form 18 is suitable as a micro connecting element 3 for high-frequency applications. However, when there are a large number of such micro connecting elements 3, short-circuits may occur if they cross over and the outer layers 8 thereby touch. Consequently, this coaxial micro connecting element 3 is preferably used within a semiconductor device which has an insulating plastic package molding compound that electrically insulates and completely surrounds the micro connecting element.

Figure 3B:
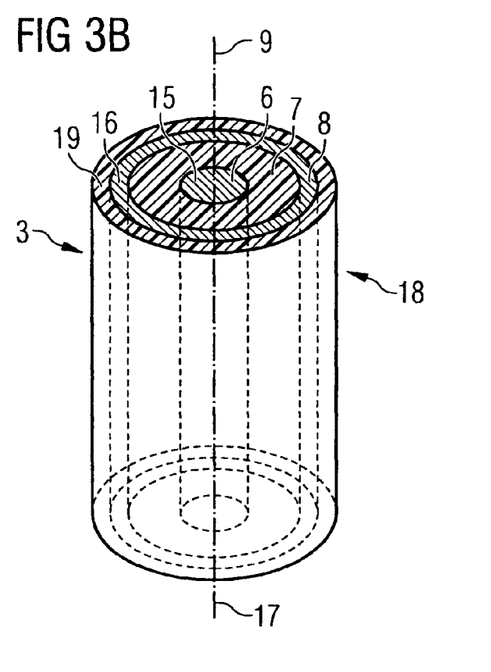

For applications in which the semiconductor chip and the micro connecting elements are not to be embedded in an insulating plastic package molding compound, the micro connecting element 3 comprising four layers that is shown in FIG. 3b is of advantage, the fourth layer 19 having an insulating material in the form of a dielectric and ensuring that the micro connecting elements can cross over without causing one another short-circuits.

Figure 4A:
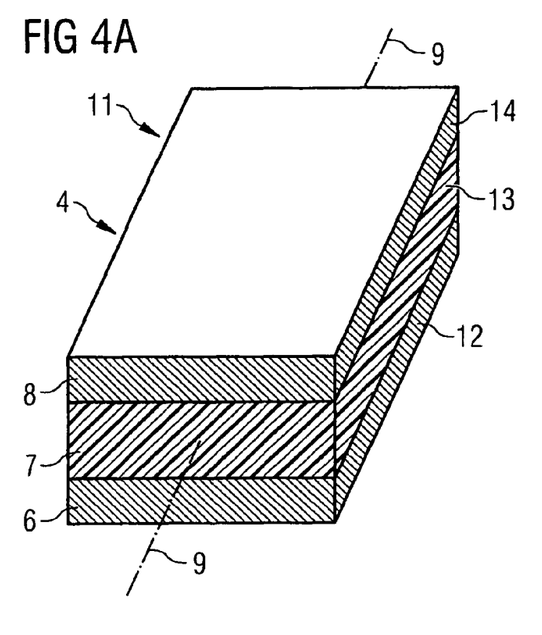
FIG. 4 illustrates a number of perspective views of strip-formed micro connecting elements.

FIG. 4 illustrates a number of perspective views a), b) and c) of strip-formed micro connecting elements 4. In FIG. 4a, the center line 9 of this strip structure 11 lies in the center of the second layer 7 of the micro connecting element 4 and forms an axis of symmetry in relation to the first layer 6 and the second layer 8. The first layer 6 forms a first metallic strip 12, in the same way as the third layer 8 represents a metallic strip 14. The metallic strips 12 and 14 are kept at a uniform distance from each other by the second strip 13 of a dielectric or an insulating material. Such a waveguide has the advantage that its transition to components of a semiconductor device can be made simpler. With appropriate bonding tools, a reliable connection can be achieved between contact areas arranged in pairs on the components of the semiconductor device and one end of the micro connecting element 4.

Figure 4B:
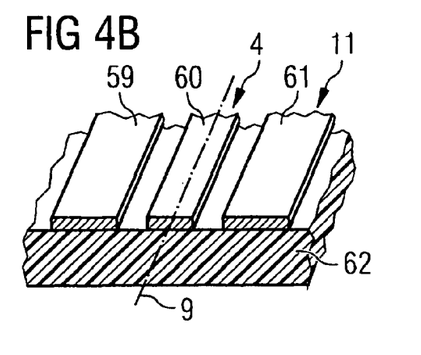

In FIG. 4b), three layers are arranged in strip form next to one another in a coplanar manner and the center line 9 of this strip structure 11 of the micro connecting element 4 lies in the center of the middle strip. The three strips 59, 60 and 61 are arranged together on an insulating strip of a thin film 62 a few micrometers thick.

Figure 4C:
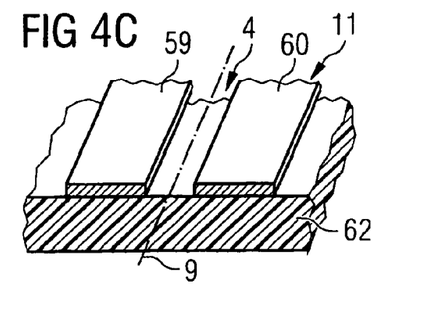

In FIG. 4c), two layers are arranged in strip form next to one another in a coplanar manner and the center line 9 of this strip structure 11 runs between the two strips 59 and 60. These strips 59 and 60 of the micro connecting element 4 are also arranged on a thin film 62 a few micrometers thick. The two strips 59 and 60 form a so-called slotted line.

Figure 5:
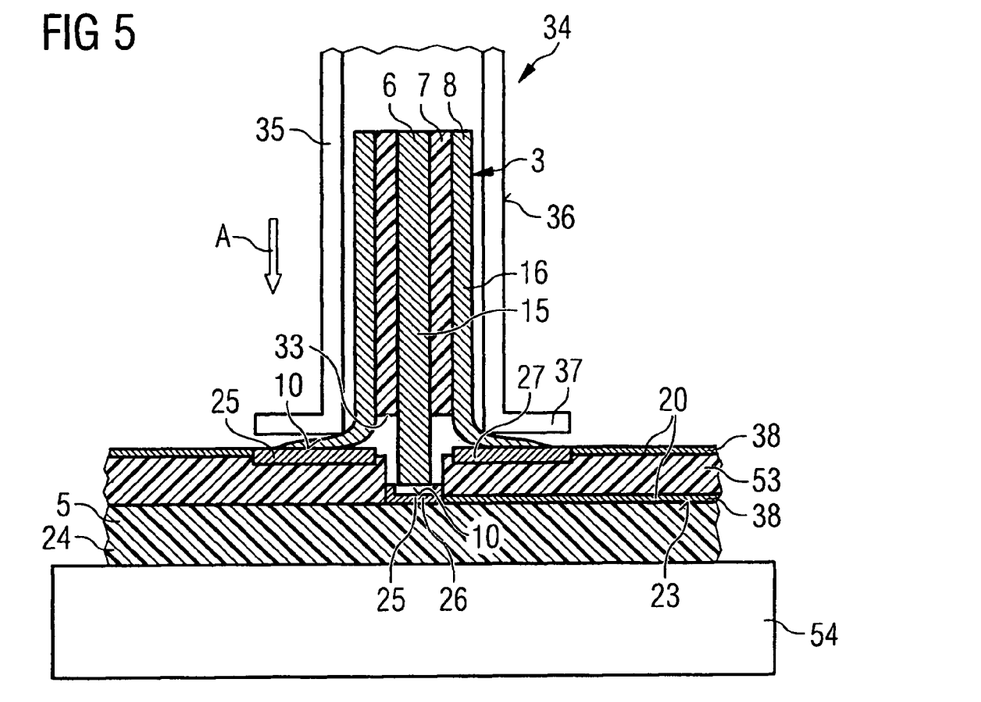
FIG. 5 illustrates a schematic cross section through a prepared transition from a coaxial micro connecting element to a strip line of a component of a semiconductor device.

FIG. 5 illustrates a schematic cross section through a prepared transition from a coaxial micro connecting element 3 to a pair of strip lines 38 of a component 5 of a semiconductor device. For this purpose, a bonding tool 34 with a hollow stylus 35, which guides the coaxial micro connecting element 3 in its cavity, is made available. In preparation for this, the insulating layer 7 is soldered onto the end 33 of the coaxial micro connecting element 3, so that a cylinder of the outer conductor 16 is available for bonding and a rod from the inner conductor 15 protrudes out of the soldered-on end 33 of the coaxial micro connecting element 3.

Prepared on the upper side 23 of a circuit carrier 24 is a pair of strip lines 38, into which the high-frequency signals of the coaxial micro connecting element 3 are to be coupled. For this purpose, a pair of contact terminal areas 10, formed by concentrically arranged disks 26 and 27, is prepared on the upper side 23, the inner disk 26 being arranged offset in height with respect to the outer disk 27 and connected to a buried strip-form interconnect 20. The outer disk 27, arranged concentrically thereto, on the upper side of the pair of strip lines 38 is connected to an associated upper strip-form interconnect 20 of the pair of strip conductors 38. Arranged between the strip-form interconnect 20 is a dielectric layer 53, so that a high-frequency wave can propagate between the metallic strip-form interconnects 20.

Figure 6:
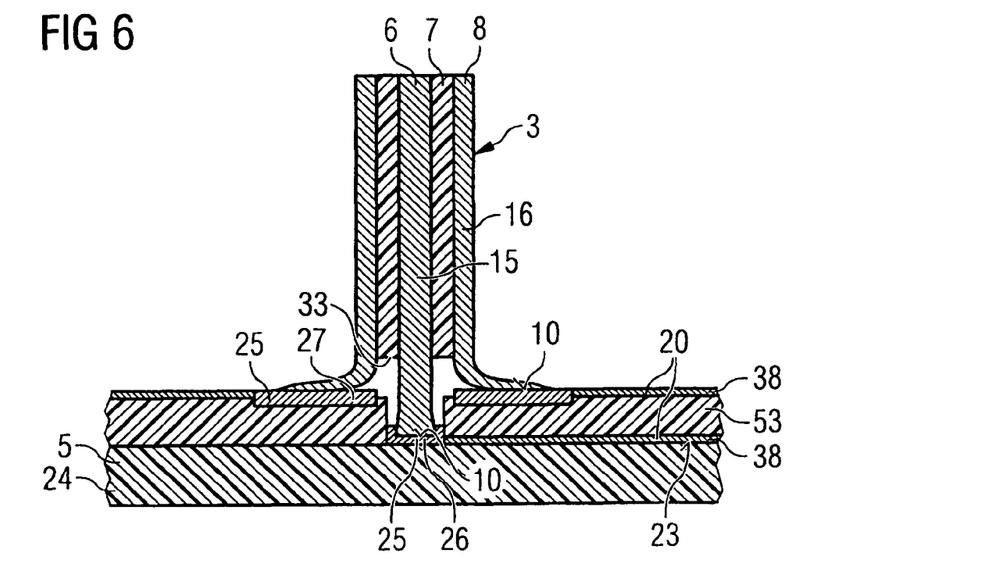
FIG. 6 illustrates a schematic cross section through a produced transition from a coaxial micro connecting element to a strip line of a component of a semiconductor device.

When a bonding tool 34 is placed onto the circuit carrier 24 in the direction of the arrow A, the concentrically arranged pair of contact terminal areas 10 is contacted. The inner conductor 15 is pressed with its protruding end onto the vertically offset inner disk 26, while a collar 37 arranged on the outer casing 36 at the end of the hollow stylus 35 presses the metallic cylinder of the outer conductor 16 onto the annular outer disk 27 of the pair of disks 25. At the same time, the circuit carrier 24 is heated up by a heating plate 54 to the extent that, with the assistance of ultrasonic excitation of the hollow stylus 35, a kind of friction-welded connection occurs between the coaxially arranged disks 26 and 27 and the coaxial micro connecting element 3. FIG. 6 shows the result of this kind of bonding.

FIG. 6 illustrates a schematic cross section through a produced transition from a coaxial micro connecting element 3 to a strip line 38 of a component 5 of a semiconductor device. The component 5 of the semiconductor device may also be a semiconductor chip, on the upper side of which a suitable pair of strip lines 38 or at least a pair of contact terminal areas 10 with corresponding concentrically arranged disks 26 and 27 is made available. With this kind of transition there is a difference in height between the external concentric outer disk 27 for receiving the outer conductor 16 and the concentric inner disk 26 for receiving and contacting the inner conductor 15.

Figure 7:
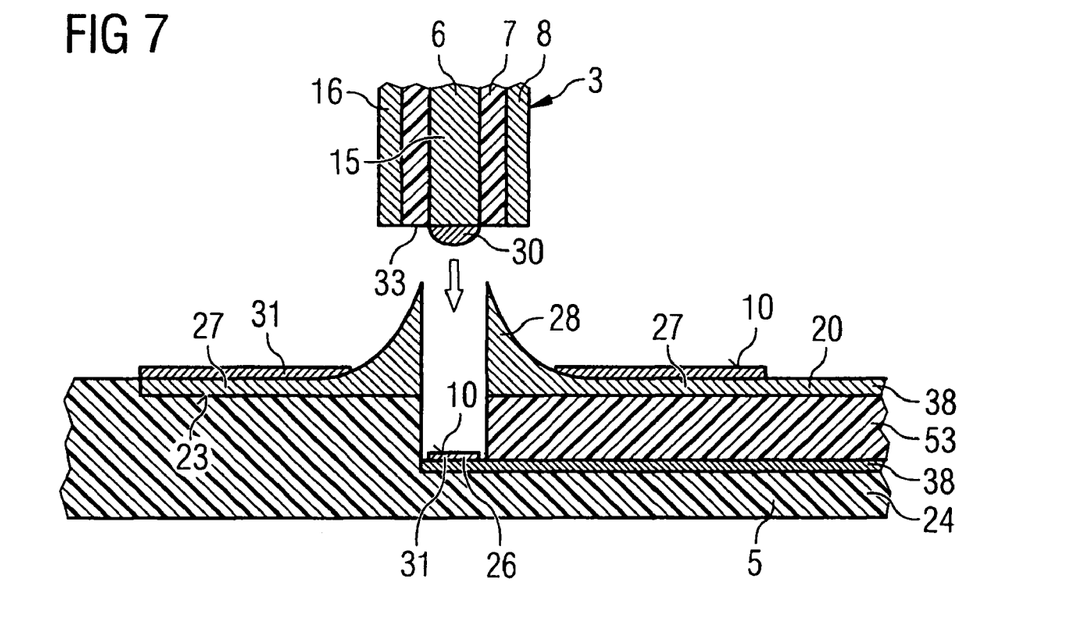
FIG. 7 illustrates a schematic cross section through a micro connecting element and a transition to a device of a semiconductor component with an annular sharp edge.
Figure 8:
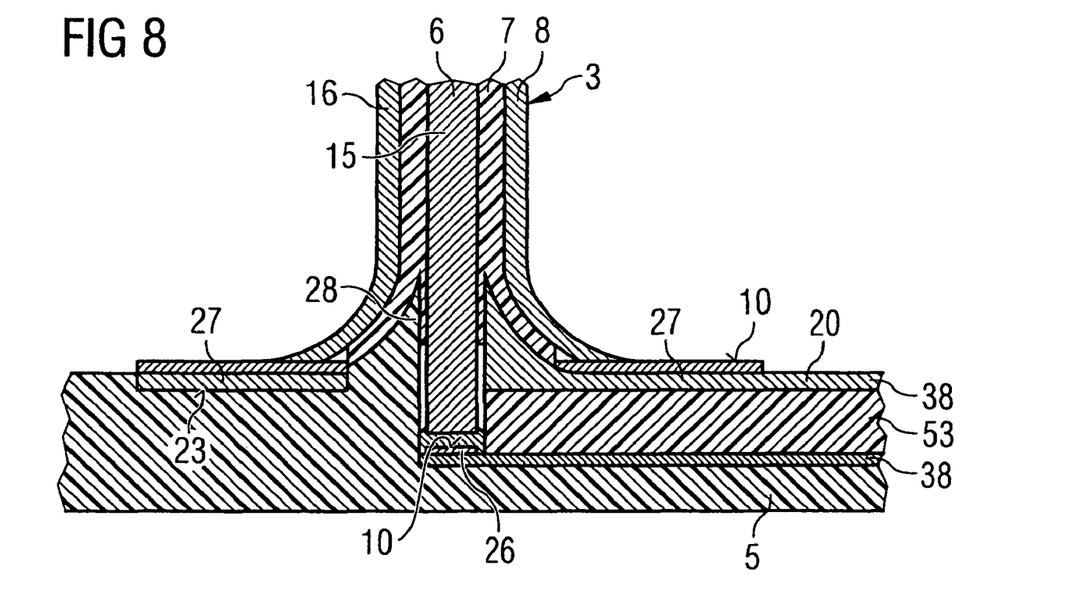
FIG. 8 illustrates a schematic cross section through a micro connecting element after producing the transition to a component of a semiconductor device.

FIG. 7 illustrates a schematic cross section through a micro connecting element 3 and a transition to a component 5 of a semiconductor device with an annular sharp edge 28. In the case of this invention, the outer disk 27 goes over into an annular sharp edge 28, which protrudes above the level of the upper side 23 of the component 5. The sharp edge 28 may consist of a metal material and is dimensioned in such a way that it can engage in the second layer 7 of the micro connecting element 3. In the case of this embodiment of the invention, a solder depot 30 is arranged on the inner conductor 15 of the coaxial micro connecting element 3, while the outer conductor 16 does not have such a solder depot. What is special about this assembly is that it is not necessary for the dielectric to be partially dissolved at the end 33, but instead the end 33 of the coaxial micro connecting element 3 can be smoothly cut off before it is placed onto the annular sharp edge 28. FIG. 8 shows the result after placement and bonding.

Figure 9:
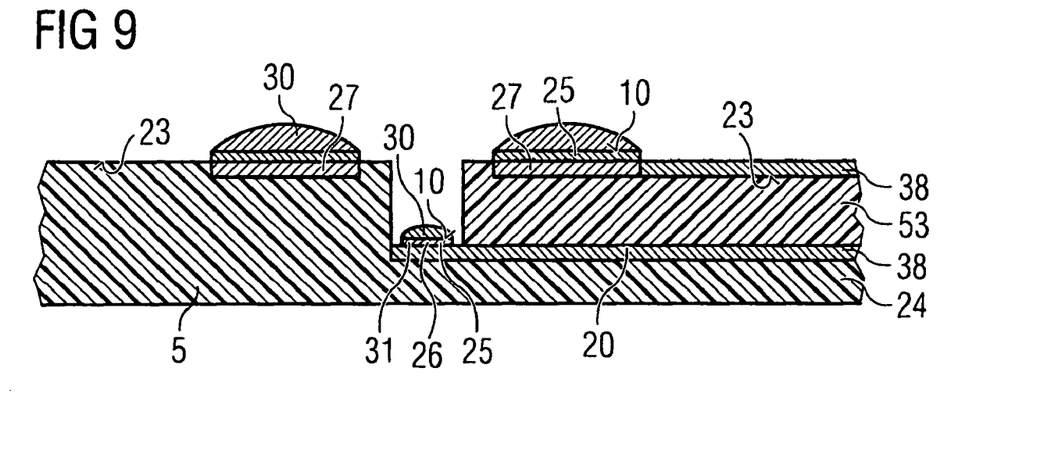
FIG. 9 illustrates a schematic cross section through a component of a semiconductor device in the region of a concentrically arranged pair of contact terminals with solder depots.
Figure 10:
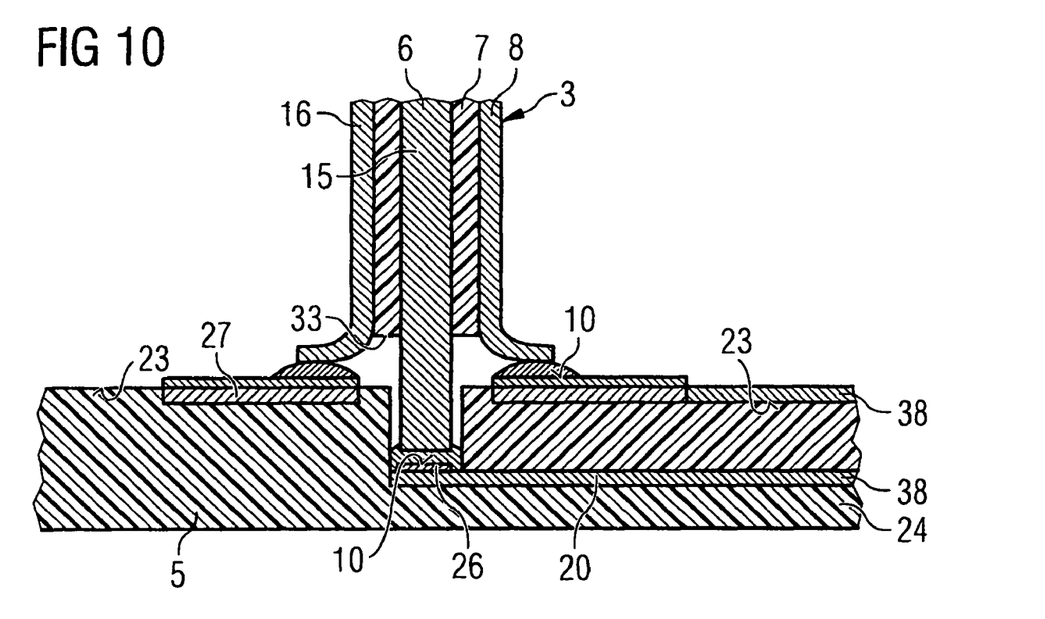
FIG. 10 illustrates a schematic cross section through a component of a semiconductor device in the region of a transition from a coaxial micro connecting element to a pair of strip lines on the upper side of a component of a semiconductor device.

FIG. 8 illustrates a schematic cross section through a micro connecting element 3 after producing the transition to a component 5 of a semiconductor device. The component 5 of a semiconductor device may be structurally formed in a way similar to that in FIGS. 5 and 6, but the annular sharp edge 28 helps in spreading open the cylindrical outer conductor 16. As a result, the material of the outer conductor 16 is guided onto the concentric outer disk 27 and can be welded on with the hollow stylus 35, shown in FIG. 5, by means of ultrasound and with the aid of a heating plate, while at the same time the solder depot 30 on the end 33 of the inner conductor 15 melts and joins with the central inner disk 26. FIGS. 9 and 10 show a further possible way of connecting a coaxial micro connecting element 3 to a strip line of a component of a semiconductor device.

FIG. 9 illustrates a schematic cross section of a component 5 of a semiconductor device in the region of a concentrically arranged pair of contact terminals 10 with a solder depot 30. In this case, an annular solder depot 30 is arranged on the outer disk 27, and on the inner disk 26 there is likewise a solder depot. The pair of disks 25 are in this case once again arranged offset in height, so that the inner disk 26 is connected to a buried strip-form interconnect 20 and the concentrically arranged outer disk 27 is in connection with a strip-form interconnect 20 on the upper side 23 of the component 5 of the semiconductor device. The upper sides of these pairs of contact terminal areas 10 have a coating 31, so that the solder depots 30 can wet the inner disk 26 and the outer disk 27. FIG. 10 then illustrates the soldering-on of a coaxial micro connecting element 3.

FIG. 10 illustrates a schematic cross section through a component 5 of a semiconductor device in the region of a transition from a coaxial micro connecting element 3 to a pair of strip lines 38 on the upper side 23 of a component 5 of a semiconductor device. As in the case of FIG. 5, it is also necessary in this case of FIG. 10 that the second layer 7 of insulating material at the end 33 of the micro connecting element 3 must be partially dissolved in order that the cylindrical outer conductor 16 can be spread onto the outer disk 27 and the inner conductor 15 can be fixed on the inner disk 26 by means of a soldering technique.

Figure 11:
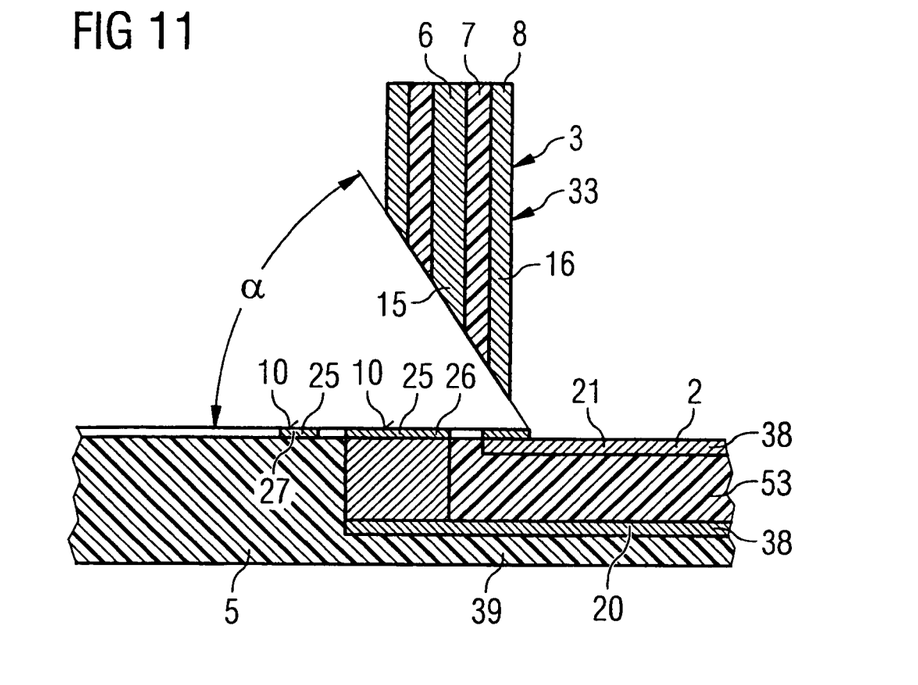
FIG. 11 illustrates a schematic cross section through a micro connecting element with a beveled end before application to a pair of contact terminal areas.

FIG. 11 illustrates a schematic cross section through a micro connecting element 3 with a beveled end 33 before application to a pair of contact terminal areas 10. The pair of contact terminal areas 10 in this case likewise has concentric disks 26 and 27, but they are not offset in height in this case, but instead the contact via between the central disk 26 and the buried strip-form interconnect 20 establishes the electrical connection with respect to the buried strip-form interconnect 20. The angle α, with which the end 33 of the micro connecting element 3 is beveled, is chosen such that the inner conductor 15 and the outer conductor 16 exactly contact the inner disk 26 and the concentric outer disk 27 when they are placed onto the pair of contact terminal areas 10. This can be seen in FIG. 12.

Figure 12:
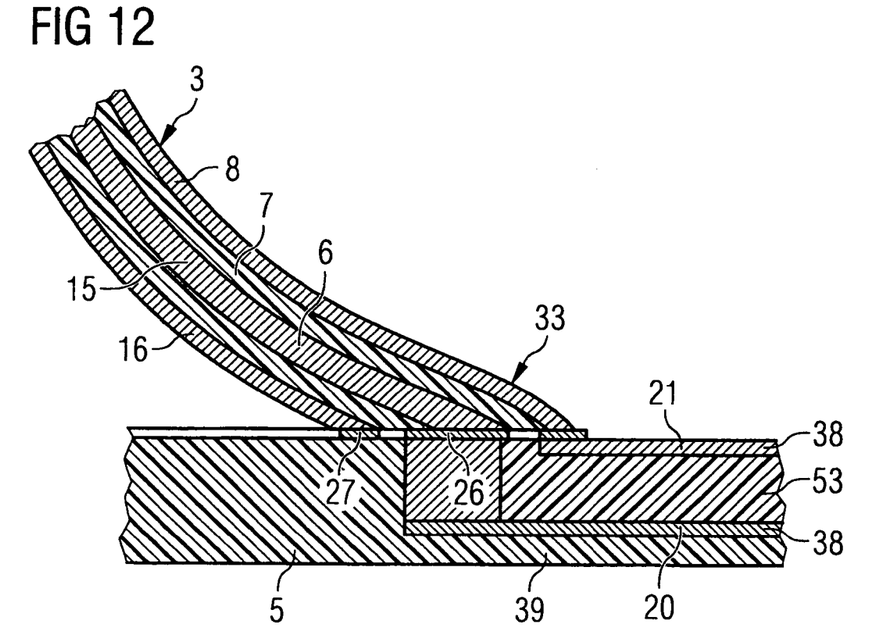
FIG. 12 illustrates a schematic cross section through a micro connecting element according to FIG. 11 after bonding on a pair of contact terminal areas.

FIG. 12 illustrates a schematic cross section through a micro connecting element 3 according to FIG. 11 after bonding on a pair of contact terminal areas 10. For this bonding, the hollow stylus shown in FIG. 5 is not used, but instead an ultrasonic stylus which has two, differently formed, legs, so that a pressure can be exerted on the inner conductor 15 and the outer conductor 16 simultaneously, without the micro connecting element 3 of the bonding wire being guided within a hollow stylus, but instead it is held only by a lateral through-eyelet of an ultrasonic stylus.

Figure 13:
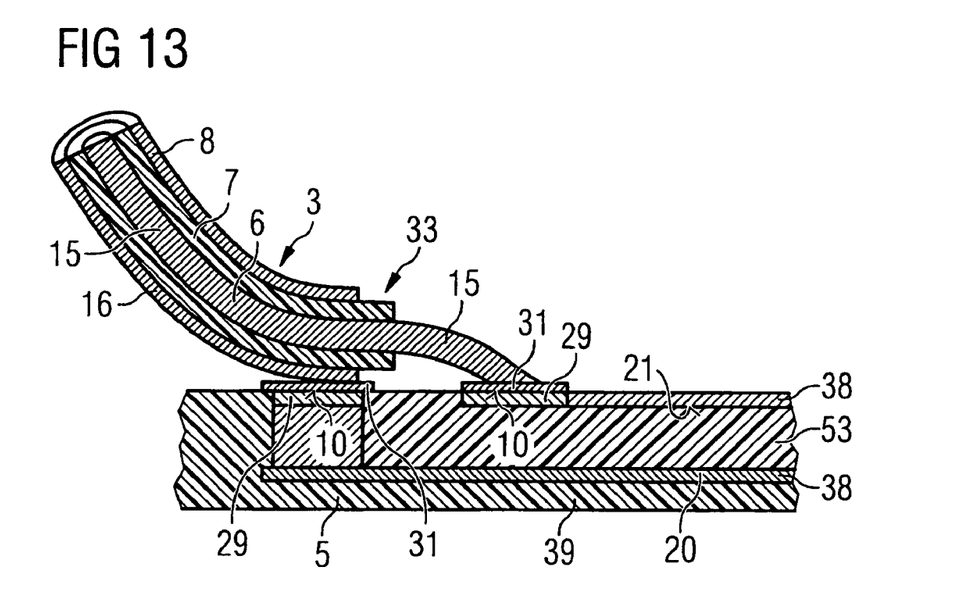
FIG. 13 illustrates a schematic cross section through a micro connecting element with a stepped end, which is bonded on a pair of contact terminal areas.

FIG. 13 illustrates a further possible way of applying a concentric micro connecting element 3 to a component 5 of a semiconductor device. In this case, the end of the micro connecting element 3 is stepped in such a way that the inner conductor 15 protrudes the furthest and the outer conductor 16 protrudes less far than the second layer 7 of dielectric material. Also used here is an ultrasonic stylus which has two legs which are adapted on the one hand to the outer conductor 16 and on the other hand to the inner conductor 15 and the distance between which is adapted to the contact areas 29 arranged in pairs of the semiconductor component 5 of the semiconductor device, the semiconductor component 5 of this embodiment of the invention preferably being a semiconductor chip 39. The pair of contact terminal areas 10 is additionally provided with a bondable coating 31, which facilitates ultrasonic bonding.

Figure 14:
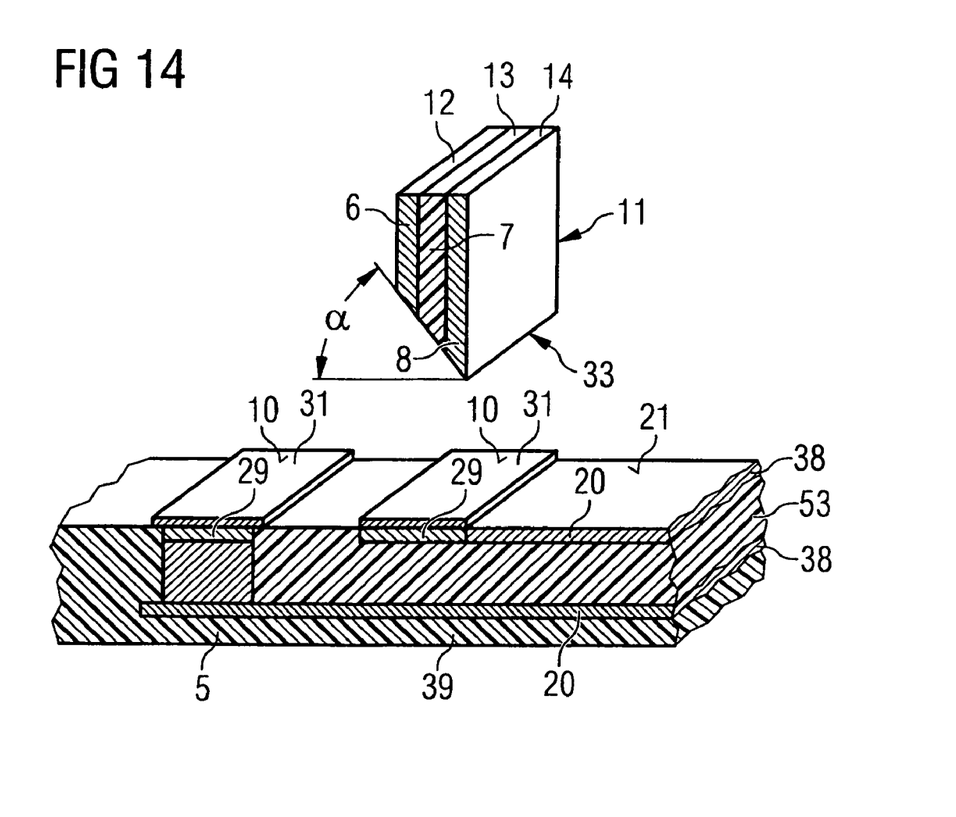
FIG. 14 illustrates a schematic cross section through a micro connecting element with strip form and with a beveled end.

FIG. 14 illustrates a schematic cross section through a strip-form micro connecting element 4 with a strip form 11 and with beveled ends 33. In this case, the beveled end 33 forms an angle α with respect to the upper side 21 of a surface of a semiconductor chip. The angle α is dimensioned such that the supporting surface of the first metallic strip 12 and of the third metallic strip 14 corresponds to the geometry and arrangement of the contact areas 29, arranged in pairs, of a pair of contact terminal areas 10. Here, the pairs of contact terminal areas are connected to a pair of strip lines 38, which is arranged on the upper side of the semiconductor chip 39. In the case of this embodiment of the invention, the dielectric layer 53 is between the strip-form interconnects 20 of silicon dioxide or a silicon nitride.

Figure 15:
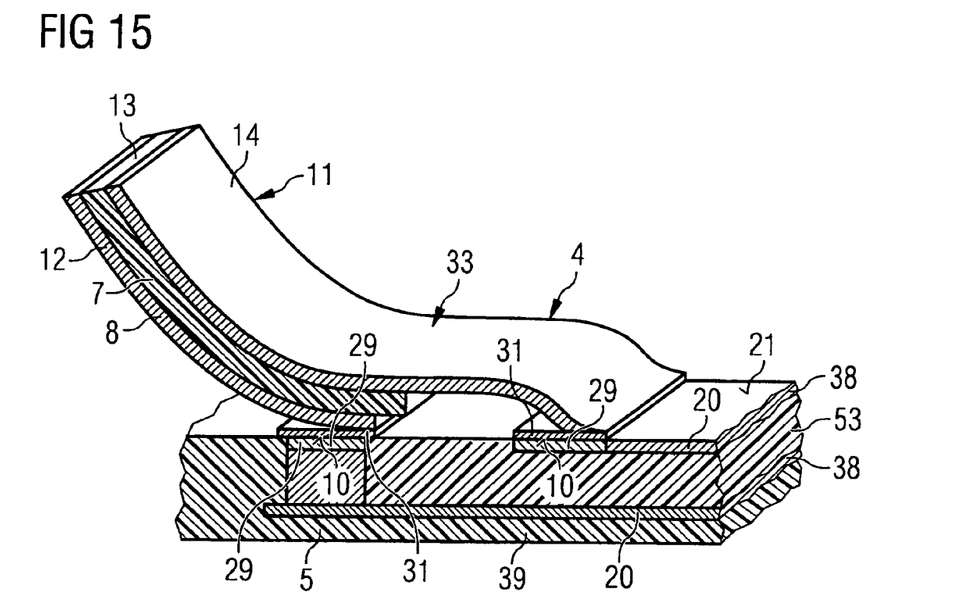
FIG. 15 illustrates a schematic cross section through the micro connecting element according to FIG. 14 after bonding on a pair of contact terminal areas.

FIG. 15 illustrates a schematic cross section through the strip-form micro connecting element 4 after bonding on a pair of contact terminal areas 10. Components with the same functions as in the previous figures are identified by the same designations and are not separately explained. In this case, the end 33 of the micro connecting element 4 was formed in a stepped manner, the first metallic strip 12 being shorter than the insulating second strip 13 and this in turn being shorter than the metallically conducting strip 14. This series of steps is adapted to the structure of the pair of outer contact areas 10 in such a way that once again the micro connecting element can be reliably bonded with its metallic strips 12 and 14 onto the contact terminal areas 29 with an ultrasonic stylus which has two different legs. For this purpose, the contact terminal areas 29 have corresponding coatings 31, which are adapted to the material of the metallic strips 12 and 14 of the micro connecting element 4.

Figure 16:
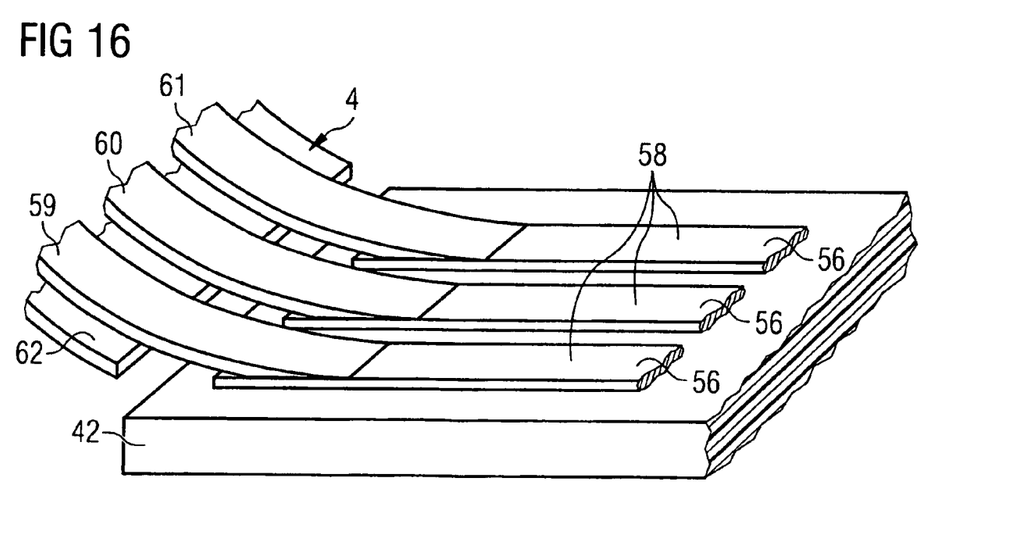
FIG. 16 illustrates a schematic perspective view of a strip-formed micro connecting element according to FIG. 4b) in contact with three strip lines of a component of a semiconductor device.

FIG. 16 illustrates a schematic perspective view of a strip-formed micro connecting element 4 according to FIG. 4b), which has three coplanar strips 59, 60 and 61 on an insulating, flexible film 62 a few micrometers thick, and is bonded on interconnects in the form of a coplanar triple strip line 56. In this embodiment of the invention, this coplanar triple strip line 56 is arranged on a wiring substrate 62 of a semiconductor device.

Figure 17:
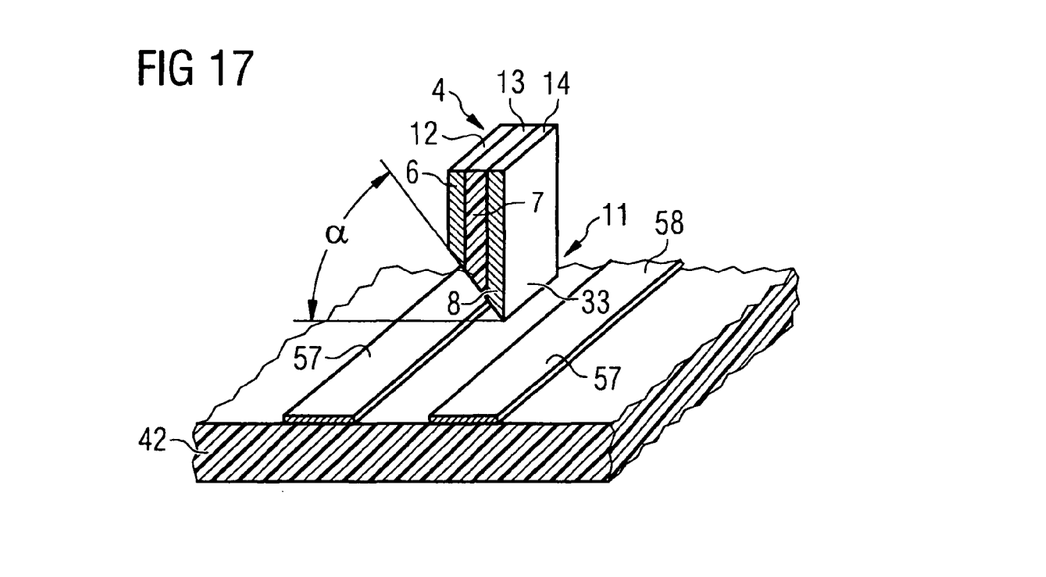
FIG. 17 illustrates a schematic perspective view of a micro connecting element with a beveled end, before application to two strip lines of a component of a semiconductor device.

FIG. 17 illustrates a schematic perspective view of a micro connecting element 4 with a beveled end 33, as it is illustrated in FIG. 14. The end 33 is located above two coplanar strip lines 57, which are arranged on a wiring substrate, this position being assumed before the end 33 of the micro connecting element 4 is tilted by the angle α and bonded onto the pair of strip lines 58, which represents a so-called slotted line.

Figure 18:
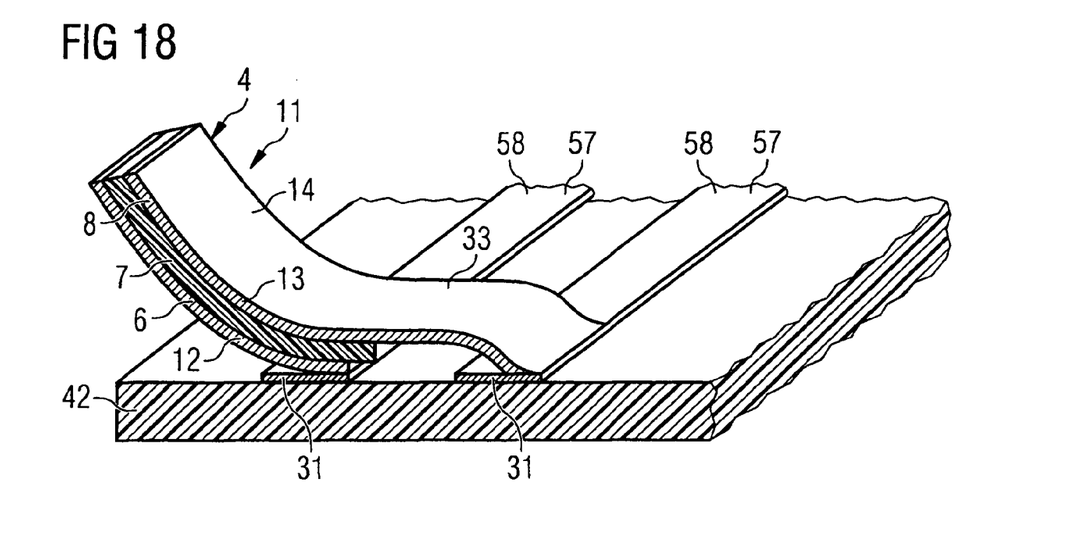
FIG. 18 illustrates a schematic perspective view of a micro connecting element with a stepped end, which is bonded on two strip lines of a component of a semiconductor device.

FIG. 18 illustrates a schematic perspective view of a micro connecting element 4 with a stepped end 33, which is bonded on two coplanar strip lines 58 of a slotted line. The slotted line may be arranged on a semiconductor chip or on a substrate 42 of a semiconductor device.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
a number of micro connecting elements for high-frequency coupling of components of the semiconductor device, the micro connecting elements configured to have an at least three-layered structural form with a first layer of conducting material, a second layer of insulating material and a third layer of conducting material, and the first and third layers extending along a common center line, shielding one another against interference fields and being fixed on correspondingly adapted pairs of contact terminal areas of the components, wherein the third layer is fixed on adapted pairs of contact terminal areas of a semiconductor chip, and wherein the third layer is electrically connected to adapted pairs of contact terminal areas of the semiconductor chip.

2. The semiconductor device according to claim 1, wherein the micro connecting elements have a coaxial form, an inner conductor comprising the first layer and an outer conductor comprising the third layer, and the center line being arranged in the region of the first layer as a coaxial axis.

3. The semiconductor device according to claim 2, wherein the coaxial form has an outer, fourth layer of insulating material.

4. The semiconductor device of claim 1, comprising:
one or more components high frequency coupled to the semiconductor device via the micro connecting elements.

5. The semiconductor device according to claim 1, wherein the pairs of contact terminal areas have contact areas arranged in pairs, the electrically conducting layers of the micro connecting elements being fixed on the contact areas of a pair of contact terminal areas, and the pairs of contact terminal areas going over to plane-parallel strip-form interconnects in the components of the semiconductor device.

6. The semiconductor device according to claim 1, wherein the pairs of contact terminal areas comprise solder depots.

7. The semiconductor device according to one of claim 1, wherein the pairs of contact terminal areas have a coating provided for bonding.

8. The semiconductor device according to claim 1, wherein the transition to the components of the semiconductor device has a coaxial contact via for the connection of the micro connecting elements.

9. The semiconductor device according to claim 8, wherein the outer disk of the contact terminal areas has a perpendicularly projecting annular sharp edge, which cuts into the second layer of the coaxially formed micro connecting element, the first layer being fixed on the inner disk and the third layer being fixed on the outer disk.

10. The semiconductor device according to claim 8, wherein the inner disk is arranged offset in height with respect to the outer disk on an upper side of the semiconductor chip and/or on an upper side of the wiring substrate and/or on an upper side of the circuit carrier.

11. A semiconductor device comprising:
a number of micro connecting elements for the high-frequency coupling of components of the semiconductor device, the micro connecting elements configured having an at least three-layered structural form with a first layer of conducting material, a second layer of insulating material and a third layer of conducting material, and the first and third layers extending along a common center line, shielding one another against interference fields and being fixed on correspondingly adapted pairs of contact terminal areas of the components; wherein the pairs of contact terminal areas comprise concentrically arranged pairs of disks, an inner disk being in electrical connection with the first layer and an outer disk being in electrical connection with the third layer, the concentrically arranged pair of disks going over to plane-parallel strip-form interconnects in the components of the semiconductor device; and
wherein the third layer is fixed on adapted pairs of contact terminal areas of a semiconductor chip, and wherein the third layer is electrically connected to adapted pairs of contact terminal areas of the semiconductor chip.

12. A semiconductor device comprising:
means for providing high-frequency coupling of components of the semiconductor device, including a number of micro connecting elements configured having an at least three-layered structural form with a first layer of conducting material, a second layer of insulating material and a third layer of conducting material, and the first and third layers extending along a common center line, shielding one another against interference fields and being fixed on correspondingly adapted pairs of contact terminal areas of the components, and the third layer is fixed on adapted pairs of contact terminal areas of a semiconductor chip, and wherein the third layer is electrically connected to adapted pairs of contact terminal areas of the semiconductor chip.

* * * * *